United States Patent [19]

Hemminger

[11] Patent Number: 4,887,029

[45] Date of Patent: Dec. 12, 1989

[54] MUTUAL INDUCTANCE CURRENT TRANSDUCER, METHOD OF MAKING AND ELECTRIC ENERGY METER INCORPORATING SAME

[75] Inventor: Rodney C. Hemminger, Raleigh, N.C.

[73] Assignee: Westinghouse Electric Corp., Pittsburgh, Pa.

[21] Appl. No.: 170,173

[22] Filed: Mar. 18, 1988

[51] Int. Cl.[4] ............... G01R 11/48; G01R 11/20
[52] U.S. Cl. .................... 324/142; 324/107; 324/127
[58] Field of Search ............... 324/117 R, 127, 142, 324/107; 323/357; 336/69, 70, 222, 229

[56] References Cited

U.S. PATENT DOCUMENTS

| 3,299,385 | 1/1967 | Stein | 336/70 |
|---|---|---|---|
| 3,449,703 | 3/1968 | Steen | |
| 3,559,133 | 1/1971 | Van Dice | 336/70 |
| 4,272,724 | 6/1981 | Wada et al. | 324/117 R |
| 4,413,230 | 11/1983 | Miller | |
| 4,491,790 | 1/1985 | Miller | 324/142 |
| 4,621,231 | 11/1986 | Heinrich et al. | 324/127 |
| 4,742,294 | 5/1988 | Gallios | 324/117 R |

Primary Examiner—Reinhard J. Eisenzopf
Assistant Examiner—W. Burns
Attorney, Agent, or Firm—R. R. Studebaker

[57] ABSTRACT

A mutual inductance differential current transducer employs a toroidal coil mounted coaxially and generally centrally of the length of an alternating current conductor wiht a conductive sheet therebetween surrounding the conductor and of substantially the same length and in insulated relationship from the conductor. The axial length of the coil is less than approximately one-third the length of the conductor, and the toroidal cross-section has a longer leg parallel to the axis of the conductor and a cross-sectional area eliminating the need for external capacitive and magnetic shielding. The coil is wound with an integer number of layers of the same number of turns per layer, the total number of turns being selected to produce a predetermined range of voltage levels of the analog voltage signal output of the coil, produced in response to and representative of the differential current flow through the conductor. The coil is wound utilizing only conventional toroidal coil winding controls with resultant winding defects in each layer producing corresponding abberations in the analog voltage signal output, the abberations of the respective such contributions for the corresponding, plural integer number of layers being substantially self-cancelling and thereby maintaining the substantially linear responsive character of the analog voltage signal output of the coil.

14 Claims, 4 Drawing Sheets

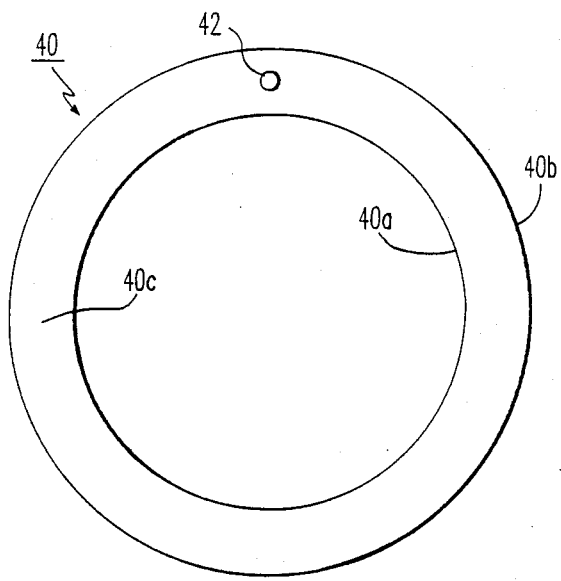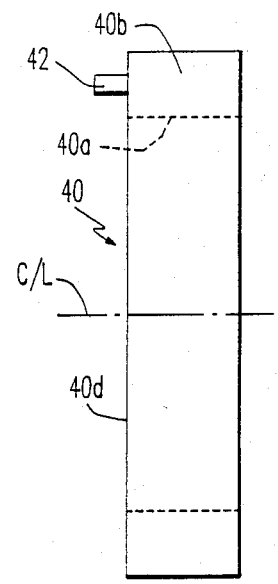
FIG. 2     FIG. 3
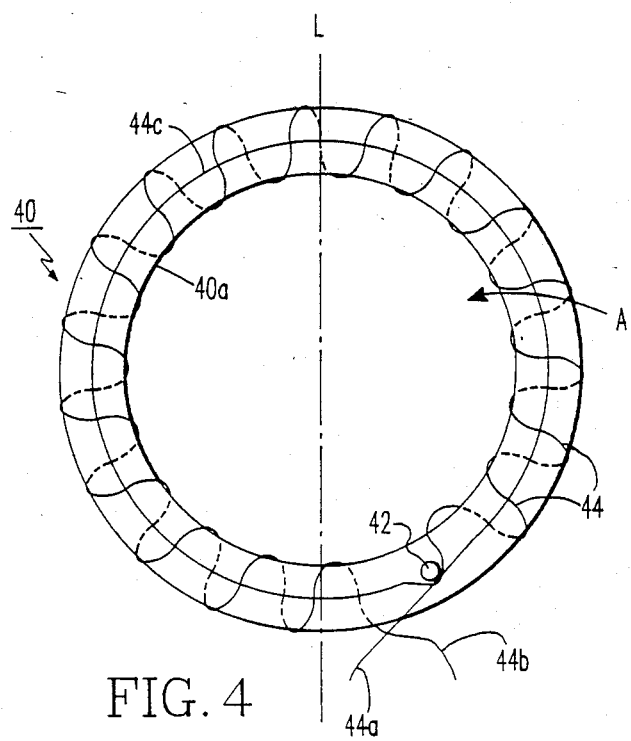
FIG. 4

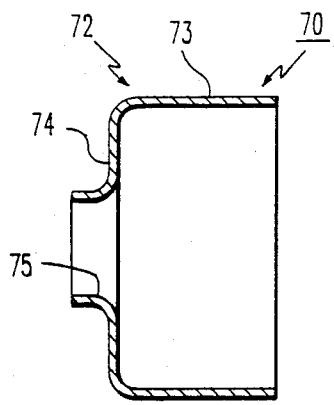
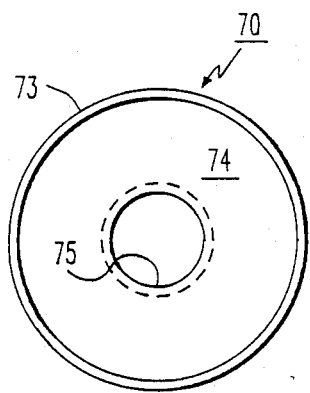
FIG. 9B  FIG. 9A
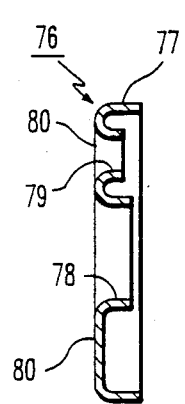
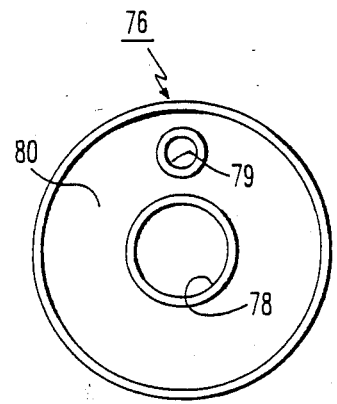
FIG. 9D  FIG. 9C

MUTUAL INDUCTANCE CURRENT TRANSDUCER, METHOD OF MAKING AND ELECTRIC ENERGY METER INCORPORATING SAME

BACKGROUND OF THE INVENTION

1. Field of the Invention

This invention relates to a mutual inductance current transducer, method of making same, and an AC electric energy meter incorporating same and, more particularly, to a mutual inductance current sensing-transducer having features of reduced size, affording significant simplification and reduced cost of production, greatly reduced capacitive shielding requirements and elimination of magnetic shielding requirements in an air core embodiment and, in an electric energy meter incorporating same, contributing to simplification of the meter assembly and to reduction of the size requirements, weight and cost of the meter.

The improved mutual inductance current sensing transducer of the present invention and an electric energy meter incorporating same relate to and represent an improvement over the subject matter of U.S. Pat. No. 4,413,230—Miller, assigned to Westinghouse Electric Corp., the assignee of the present invention, and the disclosure of which is incorporated herein. The '230 patent sets forth, in its "Description of the Prior Art," a helpful discussion of prior types of AC electric energy measuring circuitry which is useful as well to an understanding of the present invention.

One of the preferred embodiments of the present invention has particular application to so-called 200 amperes, single-phase service as typically is supplied to residential users, although in another of the preferred embodiments it may be employed for 20 amperes multiphase service.

At a typical utility customer location, 60 cycle (Hertz), single-phase AC electric power is delivered at a substantially constant line voltage of 240 volts, thus defining the voltage component of the electrical energy quantity to be measured. As is conventional, the electric power is supplied on three conductors, the center conductor being grounded and the two hot conductors each being at 120 volts in 180° out-of-phase relationship, so as to provide 240 volts total therebetween. Accordingly, two hot conductors carrying 120 volts AC power, relative to the third, ground conductor, pass through the meter Voltage and current transducers sense the magnitude of the voltage and current components of the power supplied through the meter to the loads at the customer location, and produce corresponding signals representative of those sensed components which are processed for determining the power consumed. Whereas the voltage component of the power remains substantially constant, the currents through the two conductors, which together define the current component of the electrical energy quantity to be measured, vary considerably in response to load changes. In general, the current component has levels extending throughout a range of from one-half ampere to 200 amperes, at a minimum—i.e., a current variation ratio of approximately four hundred to one. This rather substantial range, or current level variation ratio, requires that the current sensor have a substantially linear response for achieving accurate measurement of power consumption by the meter, for billing purposes.

Accordingly, standard potential transformer arrangements can provide practical voltage sensing transducers. However, current transformers capable of providing a linear response to current flows which are subject to such wide variations, in the order of four hundred to one, and producing low voltage level signal outputs are often of substantial size and cost. As is known, in accurate current transformer transducers, the ampere turns of the primary and of the secondary must be equal, and since current levels can produce 400 ampere-turns in the primary, the secondary winding sizes become substantial in order to produce linear low voltage level signal outputs. As a result, conventional current transformers which can satisfy these requirements are bulky and relatively costly.

As disclosed in the referenced '230 patent, it has long been recognized to be desirable to provide current sensing transducers for electronic AC energy measuring circuits which are highly reliable and accurate, which are adapted for standard connection to the conductors supplying the electric energy to be measured, such as the service entrance conductors of a residential electric power user's location, and which are compact in size and capable of mass production by economical manufacturing techniques. Such transducers must be operable to produce low level analog voltage signal outputs which are accurately responsive to the large variations of load currents to be sensed.

The '230 patent discloses various embodiments of electric watt-hour meter circuits designed to satisfy these criteria. In general, each of those embodiments comprises a mutual conductance current sensing transducer having secondary winding means inductively coupled to primary winding means, comprising a current conductor, which carries a current component of the electrical energy to be measured. Each of the transducer embodiments disclosed therein is responsive to the above-noted wide ratio of current variations, the secondary winding producing analog voltage output signals which are proportional to the time derivative of the current, and are suitable for processing with voltage-responsive output signals of a voltage transducer for developing AC electric energy measurement output signals representative of the power actually consumed.

The flow of current in the primary winding produces a magnetic flux field which is coupled to the secondary winding of the sensor, the latter being in sufficiently close inductive relationship to the primary winding to develop an induced voltage, $e_i = M \, di/dt$, where M is the mutual inductance between the primary and secondary windings and $di/dt$ is the time derivative of the primary current. In accordance with the above equation, the secondary winding output signal $e_i$ is representation of the time derivative of the primary current when the primary and secondary windings are mutually coupled, with or without a magnetic core. The induced, analog voltage output signal $e_i$ of the secondary winding is provided as a current responsive, analog input signal to an electronic AC energy measuring circuit. The meter also comprises a voltage sensor which is coupled to the current conductor and supplies a voltage responsive analog input signal $e_v$ which likewise is applied to the measuring circuit. The measuring circuit processes the signals $e_i$ and $e_v$ to produce a signal representative of the alternating current energy consumption. More specifically, the circuit derives the time integral of the product of the voltage and current components of the electrical energy quantity over a predetermined time interval, thereby to provide energy measurement in watt-hours. A significant factor of the measurement circuit is that it has a very high input impedance and thus effectively no energy needs to be coupled from the current flow by the current sensing transducers, this factor contributing significantly to the compactness and efficiency of the current sensing transducers of the '230 patent.

One of the preferred embodiments of the mutual inductance current sensing transducers of the '230 patent comprises a pair of toroidal secondary windings which are inductively coupled through corresponding air spaces to respective heavy gauge current conductors, each of the latter effectively forming a single turn primary winding. The air space coupling refers to the fact that the core of the toroidal secondary winding is of a non-magnetically permeable material, such as plastic, and offers the benefit of affording an absolutely linear response characteristic of the transducer. The current conductors are connected to conventional blade terminals and disposed within a meter frame, permitting conventional attachment of the meter to mating sockets of existing metering locations. A voltage sensing transducer is also mounted within the meter frame and connected between the current conductors to produce an analog voltage output signal $e_v$. The output of the toroidal secondary windings are summed in series to produce a current responsive analog voltage signal output $e_i$, representative of the sums of the separately sensed line currents in the conductors. The voltage sensor and current sensor outputs then are supplied to a processing circuit, as above described. The air core toroidal secondary windings of the '230 patent offer the benefits of a very wide dynamic range and absolute linear response characteristics. Further, because of the high input impedance of the processing circuit, and the effective absence of any need to couple energy from the conductors through the current sensors, the toroidal coils, or secondary windings, may be formed of very small gauge wire for producing the requisite analog voltage signal output levels representative of the range of current variations to be sensed.

While such current sensing transducers and associated meters incorporating same, as disclosed in the '230 patent, have achieved wide-spread acceptance in actual commercial use, there have been on-going, continuing investigations into improvements, for example to achieve size and cost reductions of the toroidal sensors and, ultimately, reduced costs and simplification of the production of meters incorporating same. The development efforts particularly addressed the desire to maintain the beneficial aspects of the toroidal air core secondary windings, in view of their beneficial characteristic noted above.

In practice, it was recognized that by maintaining precise control in the winding of the toroidal sensing coil so as to achieve effectively perfect symmetry, inherent cancellation of magnetic interference due to external, or extraneous, magnetic fields coupled to the toroidal coil could be achieved. Further, in the single phase, 200 amps, three-wire metering applications as taught by the '230 patent, the opposite directions of current flow through the two current conductors within the meter afforded mutual cancellation of magnetic interference caused by extraneous fields coupled to the toroidal coils of the respective current sensors, due to the series-summing connection of their outputs. In ideal cases and in certain practical applications, the need for magnetic shielding thus could be avoided. In many practical applications, however, magnetic shielding was required.

The '230 patent further teaches the provision of capacitive shielding of the toroidal coils of the current sensors. A thin layer of highly conductive material, such as copper, is formed as a cylindrical sleeve coaxially about a corresponding, cylindrical insulating sleeve positioned on the conductor/primary winding and the toroidal coil is coaxially positioned on and mounted to the sleeve at a position intermediate its ends. Further, a cup-like metallic shield is formed about the exterior of the toroidal coil and electrically connected to the sleeve and grounded. Where magnetic shielding as well is required, the cup-like shield is made of a suitable magnetically permeable material. In practice, due to the inability to eliminate sources of magnetic interference at the metering installations, routine practice dictated that the toroidal secondary windings, or coils, be precision wound to maintain near-perfect symmetry to achieve the inherent cancellation effects above noted, and that the cup-like shield provide both magnetic and capacitive shielding.

Various efforts were undertaken to define simplified ways to reduce or effectively cancel the adverse effects of the extraneous magnetic fields on the toroidal coils and also for reducing the costs of production, but without success. For example, techniques were pursued for achieving precise winding of the toroidal coils, in a single layer of turns so as to maintain essentially perfect symmetry, the toroidal coils being otherwise of the conventional type employed in meters for residential 200 amperes service as above-noted and as disclosed in the '230 patent. The concept was directed to optimizing the inherent cancellation of extraneous or external magnetic fields by each toroidal coil, due to the essentially perfect symmetry. This, however, required extraordinary precision controls not attainable in normal production operations, due to usual machine tolerances and the like. Other efforts were directed toward developing a magnetic shield structure, such as by providing external iron shields of low cost which would be effective against extraneous, interfering magnetic fields. These efforts, however, required excessively large shielding structures incompatible with the space limitations within the meter, and were soon recognized to be unattractive and unacceptable. Moreover, these and other efforts directed to providing soft magnetic shields of various types had the adverse effect of causing a slope, or tilt, to the current sensor response curve, rendering it incapable of providing the desired linear response over the required range, or ratio, of the variations in current levels to be sensed, i.e., the minimum 400 to 1 ratio above-mentioned.

Accordingly, there has been a continuing need for achieving a toroidal coil secondary winding, for use in a differential current sensor, which is of reduced manufacturing costs, but which provides the requisite linear response and wide dynamic range characteristics, and produces output voltages of the required levels so as to be compatible with existing processing circuits—but which is essentially, inherently, unaffected by extraneous magnetic and electrostatic fields thereby to minimize or eliminate the need for magnetic and electrostatic shielding structures. Necessarily, it was recognized that a toroidal coil usable in a differential current sensor and meeting these optimistic goals would contribute significantly to a reduction in the internal space requirements therefor within an electric meter and, correspondingly, in the complexity of assembling such meters and in their ultimate cost of production.

SUMMARY OF THE INVENTION

In accordance with the present invention, it was surprisingly discovered that a toroidal coil, for use is the secondary winding of a mutual inductance current sensing transducer in electrical energy meters as above-described, and having the desired structural and electrical characteristics, could quite readily be achieved. Several factors cooperated in achieving that result. The following description of the invention is not intended to represent the sequence in which those factors were conceived and/or discovered, but rather to afford guidance to those of skill in the art of a sequence of design considerations and steps best suited to enable the actual practice of the present invention.

As discussed above, a significant factor in the development of the toroidal coil of the invention is that the differential current responsive analog voltage signal outputs produced thereby are to be processed by solid state circuits having very high level signal input impedance and very small, virtually negligible input current requirements. Thus, there is virtually no required power transfer from the primary winding (i.e., the current conductor(s) of a typical electric power meter) to the secondary winding. Thus, the teachings of the '230 patent of employing a core material of plastic or other non-magnetic, non-metallic material, constituting effectively an air gap insofar as electromagnetic characteristics are concerned, remain applicable. As taught by the '230 patent, the air gap core affords the required linear and wide dynamic response characteristics.

However, an air gap core, as applied in practice, imposes certain constraints on toroidal coil size and configuration, for achieving the required range of voltage levels of the analog voltage signal output. Specifically, that range typically is from 100 millivolts down to 0.5 millivolt (and lower), in linear relationship to variations in the current flow being sensed of from 200 ampere turns down to 1 ampere turn (and corresponding lower ampere turn values)—i.e., a linear relationship of 0.5 millivolts per ampere turn. In actual practice, the necessary range is typically greater, and thus these limits are provided merely as an order of magnitude consideration as to the design objectives which must be satisfied. The air gap core, of course since having very low magnetic permeability relatively to typical magnetic core materials, imposes the need for a substantial effective toroidal winding cross-sectional area, to achieve the necessary output voltage levels from the field induced therein by the primary winding/current conductor. The design objective of achieving a toroidal coil of reduced size yet maintaining the air core thus conflicts with the need for maintaining the voltage level range of the electrical output signals from the current sensor, as required by the existing signal processing circuits and with which the current sensors are to be employed. Nevertheless, the reduced cross-sectional area and corresponding reduced size of the toroidal coil is a critical factor for achieving a reduced level of response of the toroidal coil to extraneous magnetic fields Accordingly, initial consideration was given to determining a desirable and perhaps ideal, reduced cross-sectional area of the toroid, i.e., the cross-section as defined in the '230 patent as taken through an annular section of the toroid, in a plane extending from and including the axis of the toroidal coil and passing radially outwardly. This led to considerations of the appropriate relative cross-sectional dimensions, i.e., axial length and effective inner and outer diameters, of the toroidal coil.

In accordance with the invention, the axial length of the toroidal coil, and thus the longer leg of its rectangular cross-section, is selected to-be less than one-third the length of the current conductor/primary winding, and preferably no greater than approximately one-fourth that length. In selecting this ratio, it was resolved that the principal source of extraneous capacitive interference arises from the current flow is the current conductor/primary winding. Accordingly, by shortening the axial length of the toroidal coil and correspondingly the longer leg of the rectangular cross-section, in accordance with the stated aspect ratio relative to the axial length of the current conductor/primary winding, and by surrounding the latter substantially throughout its length with a capacitive shield of a highly conductive metal such as copper, the extraneous capacitive coupling from the conductor, even due to fringing effects is effectively eliminated. Thus, substantially complete capacitive shielding of the toroidal coil is achieved, without the need of an external, capacitive shield enclosure.

While affording this very desirable result, however, the shortened axial length of the toroidal coil and the corresponding, reduced length of the wire segments of each turn which lie parallel to the common axis of the toroidal coil and the conductor/primary winding, reduces the level of the signal induced in the toroidal coil by the current flow in the primary winding which is to be sensed. Moreover as taught by the '230 patent, the longer leg of the rectangular cross-section, as thus defined, should be parallel to the axis of the conductor/primary winding. This relationship is consistent with minimizing the cross-sectional area of the toroid and correspondingly the sensitivity of the toroidal coil to magnetic interference moreover, this relationship maintains the outer parallel segment of each turn, corresponding to the outer longer leg of the cross-sectional area, in a more inwardly disposed radial position and thus in a relatively stronger flux field as produced by the current flow through the current conductor/primary winding. Nevertheless, the toroidal coil of the reduced size was clearly incapable of producing the requisite output voltage levels.

While it was recognized that the required output voltage levels could be achieved by increasing the number of turns in the toroidal coil, there was no assurance that a toroidal coil so configured and constructed, would have the symmetry believed to be necessary for producing the required linear response characteristic of the sensor. Specifically, prior practical experience dictated that a precision wound, single layer coil was necessary, for achieving adequate symmetry. The need, as now presented, of increasing the number of turns to achieve the required voltage level outputs necessarily implied plural layers of such turns, thus compounding the difficulty of producing a coil having the required symmetry.

On the other hand, an unexpected benefit was provided by virtue of the reduction in the axial length of the toroidal coil, relative to current practice. Specifically, commercial toroidal winding equipment requires that the wire be first wound from a supply spool onto a bobbin which then is passed by the winding equipment about the annular structure of the core in forming each turn about the cross-sectional area, i.e., in a complex path, or plane, extending in a first parallel axial direction through the annular core central opening, radially outwardly over a first planar end surface, in the opposite parallel axial direction along the outer circumference, and then radially inwardly over the second planar end surface and re-entering the central opening in the first axial direction, thereby to complete a single full turn. The winding equipment essentially passes the bobbin through a fixed radius in tracing out this path for winding each turn, that fixed radius dictating the minimum permissible internal diameter of the toroidal coil, as a function of its axial length. Because of the reduction in axial length of the toroidal coil of the invention, the interior, or inner, diameter of the toroidal coil may be reduced, relatively to a toroidal coil of greater axial size, while still accommodating the fixed radius of travel of the bobbin. This has the beneficial effect of disposing the cross-section of the toroidal coil, and thus each turn, more closely adjacent the conductor surface (i.e., allowing for the necessary annular spacing therebetween for an insulating layer and the conductive shield, as before-described). As a result, the toroidal coil encounters a stronger flux field from the current flow through the conductor/primary winding, thus increasing the output voltage levels for a given number of turns and a given cross-sectional area of the turns, relative to a toroidal coil having the same number of turns and cross-sectional area but displaced further from the conductor surface by a larger internal diameter of the toroidal coil.

The problem remained, however, that the required range of output voltage levels could not be produced by a single layer of turns about the toroidal air core—i.e., which prior practice dictated was necessary for achieving the requisite symmetry. Particularly, based on prior experience, winding a toroidal coil of plural layers of plural turns each would exacerbate the problems of maintaining symmetry, in view of the predictable winding defects which would be countered in winding that more complicated, plural layer toroidal coil. For example, in any given layer of turns, including the first layer of turns wrapped directly about the core, a given turn may bind on an adjacent, prior turn, in whole or in part, rather than lying down neatly in immediately adjacent relationship and in the same complex plane of that prior turn. The super-positioned relationship moreover alters the spacing, or pitch, of the involved turns and introduces the alternative and additional defect of an unintended gap being created between subsequent, adjacent turns and additional pitch variations. Predictably, the potential for these defects occurring would increase in a plural layer coil structure, and extreme precision winding controls would be required to avoid these defects and maintain the desired symmetry.

Despite the apparent obstacles thus presented, it was nevertheless determined to wind a toroidal coil having the required number of turns in multiple layers, and to evaluate its response characteristics. A design parameter was first established, that the required total number of turns would be formed in an integer number of layers, i.e., each layer extending through substantially the same 360° extent, or circumferential length, of the toroidal coil and each layer having, the same number of turns. To facilitate achieving that design, a protruding marker is formed on the plastic core, such that each 360° rotation of the core during the winding operation can be readily monitored, thereby to assure that the required number of turns is formed in each complete layer for the required number of layers. Further, a compensating turn of wire was arranged to extend circumferentially about the toroidal core, on one of its planar end surfaces, for each layer of turns. This is accomplished, in accordance with a preferred embodiment of the invention, by retaining a length of wire, typically termed the "start end," beyond that used in winding the first turn on the core, which is wound as a single loop or turn along a circular path on one of the annular end surfaces of the core as the latter is rotated, such that it is secured underneath each successive turn as wound onto on the core by the moving bobbin. The resultant coil thus has, by automatic and direct result, the necessary compensating turn for each complete layer of turns.

A toroidal coil, in accordance with the above design criteria, was wound using only normal, or conventional, controls of the commercial toroidal winding equipment. In other words, no attempt was made to achieve absolute uniformity of spacing and pitch of the turns and the absence of winding defects—i.e., as would characterize a coil having "perfect symmetry" and produced by precision winding control techniques. The only specific controls were those above-defined, of assuring that the same number of turns is formed on each layer with a normal degree of uniformity, and that the compensating turn is automatically formed in each 360° rotation of the core, for the required, integer number of layers. A pair of toroidal sensor coils, so constructed, were assembled on corresponding current conductor/primary windings of an electric meter of the Class 200 type, above described, with the above-described insulating and capacitive-shield metal layers therebetween, and tested. It was found to have the required linearity of response and wide dynamic range, and to be unaffected by externally coupled magnetic fields, despite the absence of any external magnetic shield and moreover to be insensitive to any capacitive interference effects resulting from the current flow through the current conductor/primary winding. Further, each such toroidal coil, as installed in the Class 200 type meter above-described, functioned individually to provide a significant degree of inherent cancellation of magnetic interference and, due to the voltage summing relationship, to provide mutual cancellation of magnetic interference effects as between the summed outputs of the pair of toroidal sensor coils.

The toroidal coil of the invention is deemed a significant, highly beneficial, and surprising result, or discovery. It is theorized that the winding defects produced by the routine operation of the commercial winding equipment, in each individual layer, are effectively uniformly distributed throughout the coil because of the plural layers; as a result, the aberrations in the electromagnetic sensory response of the coil caused by the winding defects are self-cancelling. Accordingly, a toroidal coil that is produced in accordance with the present invention is appropriately characterized as having pseudo-perfect symmetry.

The toroidal sensor coil/secondary winding of the present invention thus is remarkable for its simplicity of structure and small size, and the ease and corresponding low cost of production. It is even more remarkable for its pseudo-perfect symmetry electrical characteristics and in that it requires no external, i.e., exterior surrounding, capacitive or magnetic interference shielding structure, when employed as a toroidal sensor coil/secondary winding in an electric power meter for sensing the time derivative of the current flow in the current conductor/primary winding, despite the stringent conditions imposed in that environment and the exacting, linear response and wide dynamic range characteristics which it must provide.

In accordance with a further embodiment of the invention, the toroidal sensor coil may be wound, as above-described, on a powdered iron core. The powdered iron core, as will be recognized, greatly increases the inductive coupling between the toroidal sensor coil when used as a secondary winding about a current conductor used as a primary winding. A toroidal coil of the invention, as formed on a powdered iron core, has particular application in 20 amp, plural-phase or poly-phase service, wherein the magnitude of the current levels to be sensed are correspondingly only a fraction of those required to be sensed in 200 amps service. Particularly, the powdered iron core maintains adequate linearity of the coil response characteristics over the reduced range of current variations required to be sensed, while improving the coupling coefficient and thus reducing the number of turns of a toroidal coil of given size and form factor, necessary to produce output voltage levels of the required range so as to be compatible with existing processing circuits of the power consumption meters. Particularly, since 20 amps bears a ratio of 1:10 to 200 amps, implying a corresponding reduction ratio of 1:10 as to the output voltage levels (i.e., for a toroidal air core coil in accordance with the present invention), by forming the coil, instead, on a powdered iron core having a magnetic permeability approaching the inverse ratio of 10:1, substantially the same coil configuration, number of integer layers, and number of turns per layer will provide the same range of output voltage levels. By adopting the same criteria as above specified in the winding of the toroidal coil on a powdered iron core, many of the same beneficial results were achieved, i.e., a linear response over the range, or ratio, of current level variations required to be sensed, and inherent self-cancellation of the effects of magnetic interference. Since 20 amp service is polyphase typically, the mutual cancellation effects as between a pair of sensory coils is not achievable and thus, in this application, an external magnetic shield is required. Nevertheless, the significant benefits of the reduction in cost and size of the toroidal coil are again achieved The foregoing and other objects and advantages of the invention will become more apparent from the following detailed description and drawings.

BRIEF DESCRIPTION OF THE DRAWINGS

FIGS. 2 and 3 are plan and elevational views, respectively, of an annular core employed for winding a toroidal coil for use as a secondary winding in a differential current transducer in accordance with the present invention;

FIG. 4 is a plan, schematic view of the winding of a toroidal coil on an annular core in accordance with the present invention;

FIGS. 9A and 9B are end elevational and longitudinal cross-sectional views, and FIGS. 9C and 9D are end elevational and longitudinal cross-sectional views of a metallic shield useable with the toroidal coil of the invention wound on a powdered iron annular core, to provide magnetic shielding when such a toroidal coil is used as a differential sensor for poly-phase current meter applications.

DETAILED DESCRIPTION OF THE PREFERRED EMBODIMENT

Figure 1:
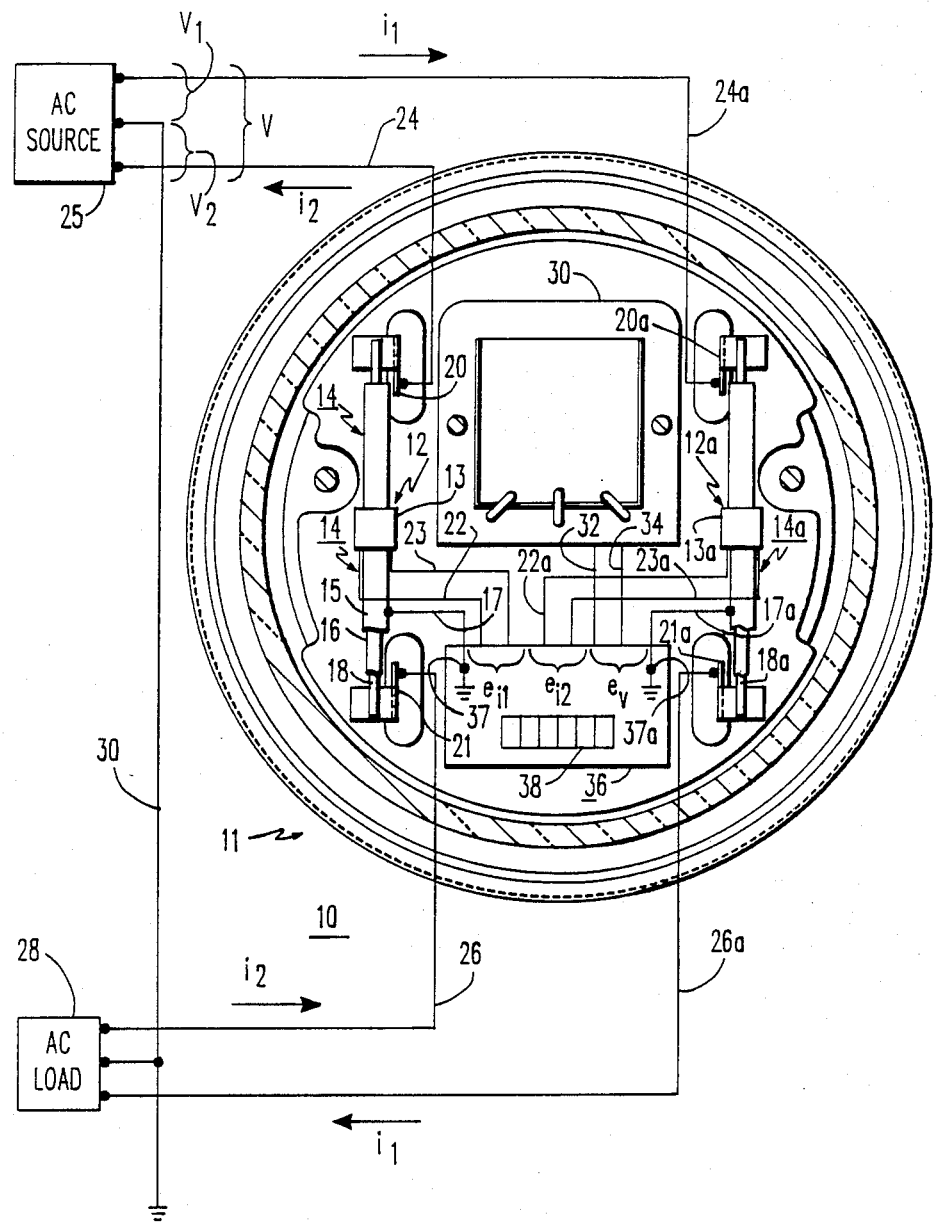
FIG. 1 is a plan view, partly broken-away and in schematic form, of an AC electrical energy, or watt-hour, meter employing mutual inductance differential current transducers in accordance with the present invention.

FIG. 1 illustrates an AC electrical energy, or watt-hour, meter 10 having a conventional housing 11 and incorporating two mutual inductance current transducers 12 and 12a with secondary windings comprising toroidal coils 13 and 13a in accordance with the invention. The toroidal coils 13 and 13a of the respective transducers 12 and 12a are mounted elongated cylindrical sleeves 14 and 14a, which in turn are received over and mounted on the respective current conductors 18 and 18a. As shown in the fragmentary section of the sleeve 14, and commonly as to sleeve 14a, it comprises an outer, highly conductive metal sheet 15, preferably of copper, and an inner, cylindrical insulating sheet 16 for electrically insulating the metal sheet 15 from the conductor 18. Leads 17 and 17a connect the capacitive shields, e.g., metal sheet 15, to ground terminals 37, 37a of processing circuits 36, to be described. The conductors 18 and 18a are in turn connected in series between the respective meter blade terminals 20, 20a and 21, 21a. As shown schematically, line-side hot wire conductors 24, 24a connect the terminals 20, 20a to an AC power source 25, and load-side hot wire conductors 26, 26a connect the terminals 21, 21a to an AC load 28. Further, a grounded neutral conductor 30 is connected between the source 25 and the load 28.

The meter 10 and the circuit connections should be understood to be illustrative of, but not limiting as to, a practical application of the improved mutual inductance current transducers of the invention. Specifically, the illustration of FIG. 1 corresponds to a typical induction watt-hour meter used by utility companies at residential customer locations. Thus, the AC source 25 may be representative of a pole top distribution transformer providing three-wire 200/120 volt, single phase, electrical power from a secondary output of the distribution transformer. The energy supplied and consumed, which is to be measured by the meter 10, is a function of the total current comprising the alternating current components $i_1$ and $i_2$ which flow through the lines 24 and 24a in opposite directions, as indicated by the oppositely oriented arrows representing current flow at an arbitrary instant in time and corresponding to a 180° phase difference therebetween, and the voltage V of 240 volts appearing across the lines 24 and 24a. Correspondingly, voltages $v_1$ and $v_2$ of 120 volts each, but of opposite phase, appear between the respective conductors 24 and 24a and the ground conductor 30.

In such a three-wire system, the current components $i_1$ and $i_2$ corresponding to a 120 volt load pass through only one of the two current ($i_1$ and $i_2$) of 240 volt loads pass through both conductors 18 and 18a, effectively in opposite directions as before-noted. In this regard, AC loads of 120 volts are connected between either and typically each of the load-side hot wire conductors 26 and 26a and the grounded neutral conductor 30 and AC loads of 240 volts are connected directly between the conductors 26 and 26a. Accordingly, whereas the total current ($i_1$ plus $i_2$) supplied to a 240 volt load passes through both conductors 18 and 18a, the unbalanced connections of 120 volt loads cause different, separate components of currents ($i_1$ or $i_2$) to flow through the respective conductors 18 and 18a. Nevertheless, the watt-hour energy computation is properly performed by sensing the voltage (the essentially consistent 240 volts) appearing across the conductors 18 and 18a and the sum of the individual currents (i.e., $i_1$ plus $i_2$) passing through the conductors 18 and 18a, which includes the components of each which are supplied to 120 volt loads and thus pass only once through the meter, i.e., through one or other of the conductors 18 and 18a, and the components of the combined currents ($i_1$ and $i_2$) which are supplied to 240 volt loads and thus pass twice through the meter, i.e., through both of the current conductors 18 and 18a. The total current ($i_1$ plus $i_2$) passing through the meter conductors 18 and 18a typically varies through amperes as a function of the impedance values of the AC load 28 being supplied. This imposes a considerable range, or ratio, of the total current variation of a minimum of 400 to 1, which must be linearly sensed to produce accurate power consumption measurement. As a result, substantial constraints are imposed on the current sensors, for maintaining linear response characteristics over this wide dynamic range of current levels to be sensed.

Meter 10 may be of the type D4S available from Westinghouse Electric Corp., Meter and Low Voltage Instrument and Transformer Division, Raleigh, N.C. Current conductors 18 and 18a, as employed in the D4S type meter, are made of a heavy gauge conductor material and are approximately one-quarter inch in diameter and have an, axial length between the blade terminals 20 and 21, or 20a and 21a, of slightly in excess of two (2) inches, imposing a limiting space factor. The toroidal coils/secondary windings of the present invention, since substantially smaller than conventional such coils, accordingly are ideally suited for use as differential current sensors in the type D4S watt-hour meter although, as will be apparent, such usage is not limiting.

The toroidal sensor coils of the invention, moreover, produce the same range of output voltage levels as the sensors heretofore employed in such meters, and as disclosed in the above-referenced '230 patent. Accordingly, reference may be had to the '230 patent for a more detailed discussion of the operating functions of such meters. Very generally, however, as shown in FIG. 1, the sensors 12 and 12a have terminal lead conductors 22 and 23, and 22a and 23a, respectively, which are connected in series and in voltage summing relationship within the measuring circuit 36. More specifically, the conductors 22, 23 and 22a, 23a have developed thereacross, by the respective toroidal coil windings of the sensors 12 and 12a, corresponding, differential current responsive analog voltage signal outputs $e_{i1}$ and $e_{i2}$ which are responsive to the sum of the derivatives of the respective currents $i_1$ and $i_2$ passing through he corresponding current conductors 18 and 18a, and which are summed by the circuit 36 to produce the combined, total differential current responsive analog voltage signal output $e_i$ ($e_i = M(di_1/dt + di_2/dt)$) wherein M is the common; mutual inductance of the primary secondary winding/toroidal coil of sensor 12 (or 12a). This analog voltage signal output $e_i$ is known to have the same frequency as, and an amplitude proportional to the sum of, the line currents ($i_1$ plus $i_2$), but has a 90 electrical degree phase shift relationship thereto, due to the mathematical derivative function included in the mutual inductance characteristics of the mutual inductance transducers 12 and 12a.

A Voltage transducer 30, which may be of any of the types disclosed in the '230 patent, produces an output voltage $e_v$ which is proportional in amplitude and equal in frequency and phase relationship to that of the line voltage V. Thus, $e_v$ and $e_i$ are representative of the voltage and current components, respectively, of the AC electric energy being supplied to the load 28 and accordingly to be measured by the meter 10.

The analog voltage output signal $e_v$ from the voltage transducer 30 is supplied over conductors 32 and 34 to the measuring circuit 36 and the analog voltage output signal $e_{i1}$ and $e_{i2}$ supplied over the conductors 22 and 22a to the circuit 36 which computes the power consumption and produces a display of that power consumption, as schematically indicated by display 38. The circuit 36 may be of known type, as disclosed in the '230 patent, and, significantly, has a very high input impedance, for example and not by way of limitation, of 50,000 to 100,000 ohms or higher. Thus, virtually no power is coupled from the current conductors 18 and 18a through the respective sensors 12 and 12a or by the voltage transducer 30 for supplying the input signals $e_i$ and $e_v$ to the circuit 36. Accordingly, very fine gauge wire may be used in winding the toroidal coils, for achieving the requisite range of voltage level outputs. For example, at 200 amperes of current flow to the load, a voltage level output of $e_i = 100$ millivolts RMS is produced for supply to the circuit 36, which decreases linearly, e.g., at a current level of 2 amperes, $e_i = 1$ millivolt RMS; at 1 ampere, $e_i = 0.5$ millivolt RMS; etc.

As noted at the outset, the toroidal coils/secondary windings 13 and 13a of the current sensors 12 and 12a are formed on so-called air type the respective current conductors 18 and 18a with respect to which they are coaxially positioned, the latter each functioning as a single turn primary winding. As also before-noted, the small size of the toroidal coils 13 and 13a facilitates assembly of the meter 10, particularly in view of the limited space available within the frame 11 and between the terminals 20, 20a and 21, 21a. Perhaps more significantly, by the reduced axial length of the toroidal coils 12 and 12a, an aspect ratio of the minimum of 3 and typically in excess of 4 relatively to the axial length of the conductive metal shield 15 is afforded, thereby eliminating any need for external capacitive shielding surrounding the toroidal coils 12, 12a. Moreover, the small cross-sectional area and the pseudo-symmetry of each of the toroidal coils 12 and 12a provides for inherent cancellation of magnetic interference within each coil and, in the particular metering application illustrated in FIG. 1, the mutual cancellation of any magnetic interference effects thereon, thereby eliminating the need for any magnetic shielding of the toroidal coils 12 and 12a. Instead, and as later detailed, the toroidal coils 12 and 12a may simply be encased in a protective covering of plastic or other suitable material and affixed to the respective sleeves 14 and 14a. In one practical embodiment, each of the completed toroidal coils 13 and 13a is of less than approximately one-half inch in axial length whereas the cylindrical metal shield 15 of the sleeve 14 (and the corresponding shield of the sleeve 14a) may be approximately 2 inches in axial length, more than satisfying the minimum aspect ratio of 1:3 for capacitively shielding the coils 13, 13a from the current flow through the respective conductors 18, 18a.

FIGS. 2 and 3 are plan and elevational views, respectively, of a plastic core 40 on which the toroidal coils of the invention are wound. The core 40 has a generally annular cross-sectional configuration in a plane transverse to the central axis C/L thereof, and inner and outer diameters of 0.380 inches and 0.680 inches, each ±0.003 inches, respectively. The axial length, or height, of the core 40 may be 0.250 ±0.003 inches. As will b appreciated from the hidden lines representing the interior surface 40a of the core 40, as seen in FIG. 3, the cross-section of the annulus in a plane extending radially outwardly from the axis or center line C/L is such as to define a longer leg parallel to, and a shorter leg transverse to the center line C/L. The core is rounded on the "corners" as defined by the cross-section at a radius of 0.032 ±0.004 inches, to accommodate the toroidal windings thereon.

In accordance with a further feature of the invention, a stub 42 is formed on the planar surface 40c of the core 40, extending in parallel relationship to the axis C/L a distance of 0.050 ±0.005 inches and radially inwardly from the outer circumferential surface 40b by 0.075 ±0.006 inches. The stub 42 serves to identify the completion of each 360° layer of turns, as formed on the core 40 during the toroidal winding operation, and thus facilitates the achievement of an integer number of such layers i.e., a complete layer of the specified number of turns in each 360° of revolution of the core 40 during the otherwise conventional toroidal winding operation.

FIG. 4 is a schematic illustration of winding a toroidal coil onto a core 40. The broken line L, oriented vertically in FIG. 4 and passing through the axis of the core 40, defines a reference position at which the first turn, of a first layer is formed, the winding proceeding in the direction of the arrow A relatively to the annular configuration of the core 40. Wire 44 is disposed so as to provide an elongated start end 44a which contacts a planar end surface of the core 40 at position radially aligned with the stub 42. The winding of a first turn then proceeds inwardly of the plane of the paper in the illustration of FIG. 4, radially outwardly behind the concealed back surface of the core 40 as seen in FIG. 4, then axially out of the paper and then radially inwardly again, to complete the first turn, and for each successive turn. While the direction arrow A thus illustrates the wind pattern as to direction and configuration relative to the core 40, in actual practice, the core 40 is rotated about its axis while the bobbin of the winding equipment proceeds through a continuous, generally circular path in the plane of line L. Core 40 accordingly is rotated in a clockwise direction as viewed in FIG. 4 for the relative wind direction indicated by arrow A. During the winding, the start end 44a of wire 44 is maintained against the inner circumference 40a of the core 40 from the designated start position and wound onto and held thereon as a single full 360° turn by the successive turns of wire 44 which are wound about the annulus in each full 360° rotation of the core 40, thus automatically providing a compensating 44c turn for each layer of complete turns of wire 44 in each complete 360° rotation of the core 40.

Figure 5:
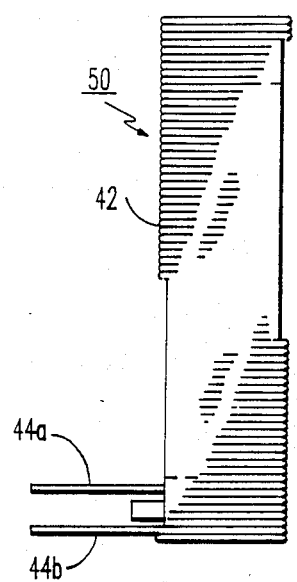
FIG. 5 is an elevational view of a completed toroidal coil in accordance with the present invention.

FIG. 5 illustrates a completely wound toroidal sensor coil 50 of the invention, the start end 44a extending from the interior circumference of the now hidden core 40 and the finish end 44b extending from the exterior circumference in generally radially aligned and displaced positions, consistent with the formation of an integer number of layers, each of a uniform number of turns. In one practical embodiment, No. 38 gauge copper wire was wound on a plastic core 40 of the described dimensions for a total of 1,440 turns and specifically in four layers of 380 turns each.

Figure 6:
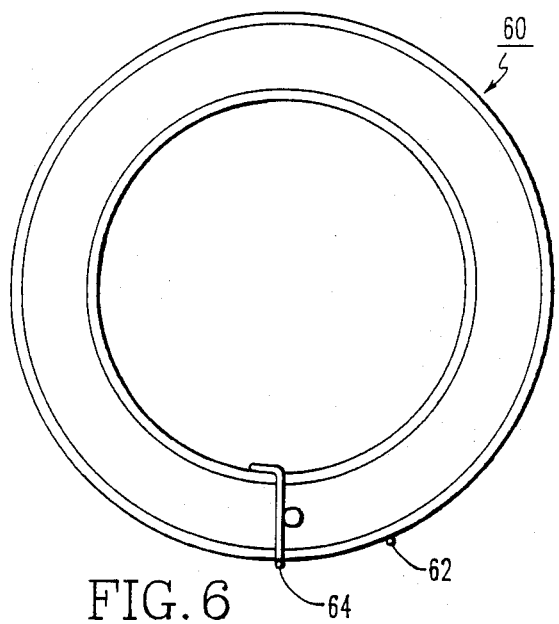
FIG. 6 is an end elevational view of an enclosure for the toroidal coil of FIG. 5.

As shown in FIG. 6, the fully wound toroidal coil 50 of FIG. 5 is received within an enclosure 60 having terminals 62 and 64 to which the start end 44a and finish end 44b, respectively, are connected and to which leads 22 and 23, corresponding to those shown in FIG. 1, for example, in turn are connected.

Figure 7:
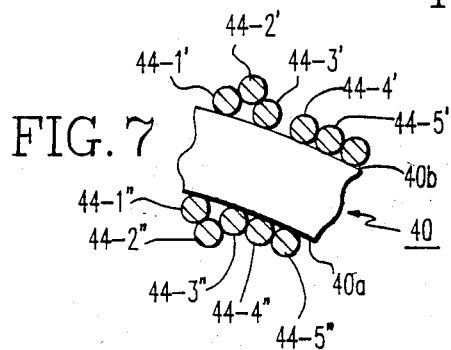
FIG. 7 is an enlarged, fragmentary and cross-sectional view of several turns of a toroidal coil wound on an annular core for illustrating the character of winding defects occuring in normal toroidal coil winding operations.

FIG. 7 is a fragmentary cross-section of the completely wound toroidal coil 50 of FIG. 5, taken in a plane transverse to the axis C/L, for illustrating the nature or character of winding defects which may occur in the winding of a toroidal coil in accordance with the invention. Particularly, FIG. 7 illustrates a fragmentary section of a core 40 taken in a plane perpendicular to the axis C/L intermediate the upper and lower, parallel planar surfaces and indicating the cross-section of successive turns of the wire in those portions extending parallel to the axis C/L and thus lying on the inner and outer circumferential core surfaces 40a and 40b. Specifically, numerals 44-1' and 44-1" represent the inner and outer segments of one turn and the corresponding primed and double primed numbers illustrate corresponding segments of second, third, fourth and fifth turns. One type of winding defect is illustrated by segment 44-2', which is displaced from the surface 40b and held in that position by the respective, preceding and succeeding turn segments 44-1' and 44-3' which in this context are too closely spaced together. A similar defect is illustrated for the turn segment 44-2" on the interior circumferential surface 40a. A further defect is the larger space than should exist between segment 44-3' and the next adjacent turn segment 44-4'.

The incidents of such defects, i.e., the percentage of turns having such defects, for the total number of turns required in the improved toroidal coils of the sensors of the invention is normally not great, even in the routine operation of the winding equipment and the exercise only of normal controls, and amounts to at most a few to several percent of the total turns. The winding defects, or imperfections, in general can be avoided by the exercise of precise control of the winding operation. However, the exercise of precision control of the winding operation, to eliminate even that small percentage of defects, imposes a substantial reduction in the speed and corresponding increase in the costs of producing the toroidal coils. Thus, the present invention not only affords the benefits of reduced size and the elimination of any external capacitive and/or magnetic shielding structures surrounding the toroidal coil, but also a significant reduction in the time and expense of winding the toroidal coils. Each such toroidal coil, despite the presence of winding defects, functions equivalently to a toroidal coil which is substantially, perfectly symmetrical as produced by precision winding operations, as to the requisite linear output and dynamic range characteristics and accordingly is characterized as a pseudo-perfectly symmetrical toroidal coil.

The toroidal coils of the invention, employed as mutual inductance current transducers in electric power, or watt, meters as hereinabove described, have proven in practice to provide the requisite range of output voltage levels, with a dynamic range and linear response characteristics more than sufficient to satisfy established accuracy standards for power consumption measurement without and without any external magnetic or capacitive shielding. While not so limited in application, the pseudo-perfectly symmetrical toroidal coils of the invention have special application for use as mutual inductance current sensors and meters of the type of FIG. 1 for single-phase, three-wire, 240 volt system. Specifically, due to the pseudo-perfectly symmetrical character of the toroidal coils of the invention, a pair thereof as employed in such meters have, individually, substantially the same response to magnetic interference which is not otherwise inherently cancelled within the individual toroidal coil and each produces substantially the same, corresponding abberations in the respective voltage outputs in response to magnetic interference; since the voltage outputs of the pair of toroidal coils are combined in additive relationship, but in an opposing sense as to the abberations produced by magnetic interference, the latter tend to be completely, mutually cancelled and thus have little or no affect on the differential current voltage outputs, as taught in the '230 patent.

Figure 8:
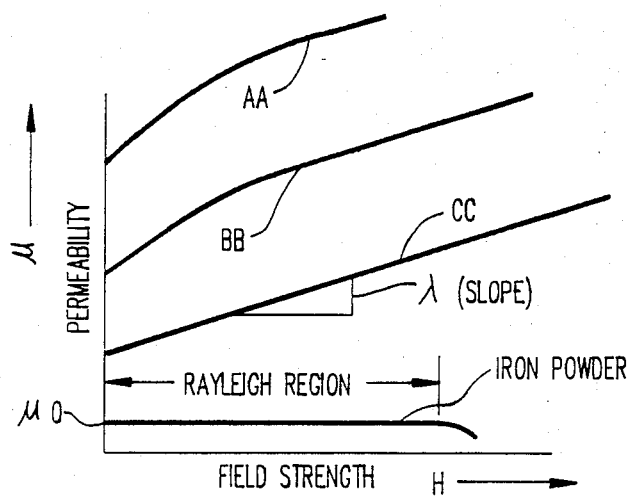
FIG. 8 is a chart illustrating permeability characteristics as a function of field strength for a powdered iron core on which a toroidal coil in accordance with the present invention may be wound.

In accordance with a further embodiment of the invention, the toroidal winding may also be employed in an inductance current transducer having a core formed of iron powder, such as carbonyl E, in accordance with the teaching of a toroidal core of that material set forth in the application entitled "Electro-Magnetic Contactor with a Lightweight Wide Range Current Transducer with Sintered Powdered Metal Core," Ser. No. 111,007, filed Oct. 21, 1987, as a continuation-in-part of application Ser. No. 016,420 filed Feb. 19, 1987, the disclosures of which application and others referenced therein being incorporated herein by reference. FIG. 8 hereof corresponds to FIG. 34 of that application, which in turn is representative of FIG. 11—11 in a publication entitled "Ferromagnetism" by R. M. Bozorth, at page 489. In FIG. 8, the permeability $\mu$ as a function of field strength H is relatively constant at a value $\mu_0$ over a relatively wide range of field strengths in a region known as the Rayleigh region, or range. The Rayleigh constant $\lambda$, which is equal to the slope ($\lambda$) of the magnetization curve is approximately equal to zero over the Rayleigh range for iron powder. Non-limiting examples of possible slopes for other ferromagnetic materials are shown at AA, BB and CC where the slope $\lambda$ is not equal to zero. Equation (1) shows the relationship of permeability $\mu$ as a function of the initial permeability $\mu_o$, the Rayleigh constant $\lambda$ and the field strength H in the Rayleigh range for any material.

$$\mu = \mu o + \lambda H \tag{1}$$

$$H = \frac{iN1}{l} \tag{2}$$

Equation (2) shows the relationship of field strength H versus current i, in which N1 is the number of turns of the primary winding (i.e., N1 = 1, or unity, in the examples of the embodiments of the invention hereinabove set forth) and l represents the circumferential length of the core.

$$\frac{\phi}{A} = \beta = \mu H = \frac{\mu N1 i}{l} \tag{3}$$

Equation (3) shows the relationship of flux ($\phi$), the flux density ($\beta$) and field strength (H).

$$v = N2 \frac{d\phi}{dt} \tag{4}$$

Equation (4) shows the relationship of the output voltage on the secondary winding of the current-to-voltage transducer as a function of flux and the number of turns N2 in the secondary winding.

$$v = \frac{N1 N2 A}{l} \frac{d\mu i}{dt} \tag{5}$$

Equation (5) shows equation (4) with the constant values clustered.

$$v = \frac{N1 N2 A}{l} \frac{d(\mu o + \lambda H)i}{dt} \tag{6}$$

Equation (6) shows equation (5) with equation (1) substituted.

$$v = \frac{N1 N2 A}{l} \mu o \frac{di}{dt} : \text{if } \lambda = 0 \tag{7}$$

Equation (7) shows equation (6) for the special case when $\mu_o$ is constant.

$$v = \frac{k di}{dt} : \text{if } \lambda = 0 \tag{8}$$

Equation (8) depicts equation (7) in a more simplified form. As a result, if an iron powder, such as carbonyl E, toroidal core is used as the core 120 of the toroidal coil of the invention, the voltage v is linearly proportional to the first derivative of the current i with respect to time. The Rayleigh region lies well within the excitation or non-saturation region for a core such as 120.

A current sensor employing a toroidal coil and a powered iron core in accordance with the foregoing and the invention herein has useful application in so-called Class 20 meters used for measuring 20 amp, polyphase power service. As is known in the art, polyphase power is supplied on three line conductors, each at the same voltage but phase-displaced by 120°. Since a common ground conductor is not employed in that instance, the current paths as schematically illustrated in FIG. 1 hereinabove differ in that three mutual inductance current transducers are employed in the meter, each comprising an elongated current conductor/primary winding and a toroidal coil wound on a powered iron core in accordance with the foregoing, each said sensor appearing substantially as an individual one of the sensors 12 and 12a in FIG. 1. The outputs of the three toroidal coil secondary windings are supplied to a summing circuit which produces a corresponding analog voltage output signal:

$$e_i' = M'\left(\frac{di'1}{dt} + \frac{di'2}{dt} + \frac{di'3}{dt}\right)$$

in which M' is the common value of mutual inductance between the primary and secondary windings of each current transducer. Since the value M' is much greater than the value M for an air core transducer as in the first embodiment of the invention, the number of turns in the toroidal coil/secondary winding of each sensor may be reduced proportionately, with respect to a given level of current flow in the current conductor/primary winding, for purposes of producing the same required range of analog voltage output signal levels. Thus, relative to the air core transducer of the first embodiment of the invention, a powdered iron core transducer of the same basic dimensions and cross-sectional area may employ toroidal coil/secondary windings of the present invention, adjusted as to number of turns in inverse proportion to the ratio, M':M, and in direct proportion to the ratio of currents 20:200. As a result, the same range of voltage levels of the summed, analog voltage output signals of the three transducers will satisfy the voltage input requirements of the corresponding signal $e_i$ to be supplied to a processing circuit such as the circuit 36 of FIG. 1 for computing the total power consumption. Such processing circuitry is deemed conventional and thus is not disclosed in detail but reference is had to the '230 patent for a further disclosure of such meters and related circuitry.

In one practical application, the permeability of the powered iron core is somewhat less than ten, e.g., a value of approximately eight. Thus, relatively to the number of turns, $N_1$ of the toroidal coil/secondary winding for a Class 200 sensor, the number of turns, $N_2'$ of a toroidal coil/secondary winding for a Class 20 sensor would be:

$$N_2' = \frac{N_2}{8} \times 10 = 1800$$

for the above example in which $N_2$ equals 1440 turns. The turns are formed consistent with the teachings above and thus in an integer number of plural layers, with the same number of turns and one compensating turn, per layer. For the example, $N_2'=1800$, four layers of 450 turns per layer would be employed.

In the Class 20 current sensor environment, the mutual cancellation of magnetic interference effects, as achieved by summing the outputs of a pair of toroidal coils in the Class 200 service environment of the first embodiment of the invention, is not achieved. Accordingly, a magnetic shield is required for each such current sensor in the Class 220 environment. A suitable such shield 70 is shown in FIGS. 9A through 9D. Particularly, the plan and longitudinal cross-sectional views of FIGS. 9A and 9B, respectively, illustrate a housing portion 72, of generally cylindrical configuration including a cylindrical sidewall 73 and an end closure 74 having a turned out, central and coaxial opening 75. An end cap 76, shown in plan and longitudinal cross-sectional views in FIGS. 9C and 9D, is of generally annular configuration, having an outer cylindrical wall 77 of an internal diameter slightly greater than the external diameter of, the cylindrical sidewall 73 of the housing portion 72 for being received thereover. The end cap 76 further includes a central, turned-in opening 78 coaxially formed therein. A toroidal secondary winding having the external configuration as shown in FIG. 5 but formed on a powered iron core is received within the housing 72 and the end cap 76 secured thereto, the leads from the toroidal coil then extending through a further, eccentrically located and turned-in opening 79 formed in the planar end surface 80 of the end cap 76. Preferably, a corresponding current conductor with a sleeve of insulating and conductive layers thereabout, similar to the sleeve 14 in FIG. 1, is positioned within the toroidal coil prior to the assembly procedure, the combined sleeve and current conductor extending through the corresponding openings 75 and 78 in the housing 72 and end cap 76 of the shield 70 in the final assembly.

A current sensor employing the toroidal coil of the invention for Class 20 service, as above described, while requiring additional magnetic and capacitive shielding as shown in FIGS. 9a-9d, nevertheless enjoys the benefits of the reduced size, and reduced cost of production, and pseudo-perfect symmetry, as before described.

Numerous modifications and adaptations of the invention will be apparent to those of skill in the art and thus it is intended by the appended claims to cover all such modifications and adaptations which fall within the scope of the appended claims.

We claim as our invention:

1. A mutual inductance differential current transducer for producing an analog voltage output signal in response to, and having a level varying linearly with respect to, the magnitude and rate of change of a flow of current supplied by an alternating current power line distribution system, comprising:

an elongated current conductor having first and second ends and a substantially straight axial portion therebetween of a predetermined length and defining a central axis;

a generally cylindrical sleeve of conductive material of substantially the predetermined length, received coaxially over the elongated current conductor in the straight axial portion thereof and electrically insulated therefrom;

a toroidal sensor coil defining a central axis and having an axial length less than approximately one-third the length of the generally cylindrical sleeve and an internal diameter substantially the same as the outer diameter of the cylindrical sleeve and sufficient to position the coil coaxially on the cylindrical sleeve, the coil being positioned coaxially thereon and generally centrally of the length thereof;

the toroidal coil having a rectangular cross-section in a plane extending radially from and including the central axis of the coil, each longer leg of the rectangular cross-section, corresponding to the axial length of the coil, being parallel to the central axis of the current conductor and each shorter leg being transverse to the central axis and defining the outer diameter of the coil relatively to the inner diameter thereof, the toroidal coil being inductively coupled and thereby responsive to magnetic flux variations produced by an alternating current flow through the current conductor for producing an analog voltage signal output which is substantially linearly responsive to the time derivative of the current flow in the current conductor throughout a ratio of current flow variations therethrough of at least 400 to 1, and the coil comprising a number of turns determined in accordance with producing the substantially lineary responsive analog voltage signal output at levels extending through a predetermined voltage range, the turns being provided in an integer number of layers, each layer comprising a common number of turns and the turns of each layer being substantially uniformly distributed about the circumferential length of the toroidal coil and having pseudo-perfect symmetry; and the toroidal coil further including a compensating turn of wire for each layer of turns, each compensating turn extending throughout the circumferential length of the coil at a position intermediate the inner and outer diameters thereof.

2. A differential current transducer as recited in claim 1, further comprising:

a core of generally annular configuration on which the toroidal coil is wound, the core substantially defining the inner and outer diameters, the axial length and the rectangular cross-section of the toroidal coil as wound thereon.

3. A differential current transducer as recited in claim 2, wherein:

the core is formed of a non-metallic, non-magnetic material having substantially the permeability of air.

4. A mutual inductance differential current transducer for producing an analog voltage output signal in response to, and having a level varying linearly with respect to, the magnitude and rate of change of a flow of current supplied by an alternating current power line distribution system, comprising:

an elongated current conductor having first and second ends and a substantially straight axial portion therebetween of a predetermined length and defining a central axis;

a generally cylindrical sleeve of conductive material of substantially the predetermined length, received coaxially over the elongated current conductor in the straight axial portion therof and electrically insulated therefrom;

a toroidal sensor coil defining a central axis and having an axial length less than approximately one-third the length of the generally cylindrical sleeve and an internal diameter substantially the same as the outer diameter of the cylindrical sleeve and sufficient to position of coil coaxially on the cylindrical sleeve, the coil being positioned coaxially thereon and generally centrally of the length thereof;

the toroidal coil having a rectangular cross-section in a plane extending radially from and including the central axis of the coil, each long leg of the rectangular cross-section, corresponding to the axial length of the coil, being parallel to the central axis of the current conductor and each shorter leg being transverse tot eh central axis and defining the outer diameter of the coil relatively to the inner diameter thereof, the toroidal coil being inductively coupled and thereby responsive to magnetic flux variations produced by an alternating current flow through the current conductor for producing an analog voltage signal output which is substantially linearly responsive to the time derivative of the current flow in the current conductor throughout a ratio of current flow in the therethrough of at least 400 to 1, and the coil having a number of turns determined in accordance with producing the substantially linearly responsive analog voltage signal output at levels extending through a predetermined voltage range, the turns being provided in an integer number of layers, each layer comprising a common number of turns and the turns of each layer being substantially uniformly distributed about the circumferential length of the toroidal coil, the turns of the coil, in each layer of turns, being wound in a conventional toroidal coil winding operation with normal winding control tolerances, the substantially uniform distribution of turns in each layer including winding defects within a normal tolerance range which produce corresponding abberations in the contribution to the analog voltage signal output of the coil as produced by each layer of turns, the abberations in the respective contributions of the plural, integer number of layers of turns to the analog voltage signal output being substantially self-cancelling, thereby maintaining the analog voltage signal output of the coil substantially linearly responsive to the time derivative of the current flow through the current conductor over the predetermined voltage range; and the toroidal coil further including a compensating turn of wire for each layer of turns, each comprising turn extending throughout the circumferential length of the coil at a position intermediate the inner and outer diameters thereof.

5. A differential current transducer as recited in claim 1, wherein:

each said coil has an axial length in the range of from 0.250 to 0.510 inches, an inner diameter in the range of from 0.250 to 0.380 inches, and an outer diameter of from 0.680 to 0.810 inches.

6. A differential current transducer as recited in claim 2, wherein the core has an axial height of approximately 0.250 inches, and internal diameter of approximately 0.380 inches and an external diameter of approximately 0.680 inches.

7. An AC electric energy meter having an electronic measuring circuit processing analog signals responsive to current and voltage components, of an alternating electric current supplied by conductors of a power line distribution system, which are to be measured for producing electronic signals representative of quantized amounts of electric energy consumption, the meter comprising:

a housing adapted for series connection of the meter with at least two of the power line distribution system conductors carrying respective separate current flows which together comprise the current component of the electric energy quantity to be measured:

a voltage sensing transducer connected in parallel with the power line distribution system conductors for producing a voltage responsive analog voltage signal proportional to the voltage component;

current sensing transducer means comprising first and second current conductors respectively, individually connected serially with the power line distribution system conductors for conducting the corresponding separate current flows of the current component, each of the current conductors having first and second ends and a substantially straight axial portion therebetween of a predetermined length and defining a central axis and effectively forming a single turn primary winding for producing magnetic flux variations responsive to the magnitude and rate of change of the separate current flow therein, and at least first and second, generally cylindrical sleeves of conductive material of substantially the predetermined length, received coaxially over the respective, at least first and second elongated current conductors in the straight axial portions thereof and electrically insulated therefrom;

the current sensing transducer means further comprising secondary winding means comprising at least first and second toroidal sensor coils wound on respective, separate non-magnetic cores, each toroidal sensor coil defining a central axis and having an axial length less than approximately one-third the length of the generally cylindrical sleeve and an internal diameter substantially the same as the outer diameter of the cylindrical sleeve and sufficient to position the coil coaxially on the cylindrical sleeve, the coil being positioned coaxially thereon and generally centrally of the length thereof, the toroidal coil having a rectangular cross-section in a plane extending radially from and including the central axis of the coil, each longer leg of the rectangular cross-section, corresponding to the axial length of the coil, being parallel to the central axis of the current conductor and each shorter leg being transverse to the central axis and defining the outer diameter of the coil relatively to the inner diameter thereof, the toroidal coils being inductively coupled and thereby responsive to magnetic flux variations produced by alternating current flows through the respective current conductors for producing a summed, analog voltage signal output which is substantially linearly responsive to the time derivative of the total current flow in the current conductors throughout a ratio of current flow variations therethrough of at least 400 to 1, and each of the coils comprising a number of turns determined in accordance with producing the substantially linearly responsive analog voltage signal output at levels extending through a predetermined voltage range, the turns in each coil being provided in an equal, integer number of layers, each layer comprising a common number of turns and the turns of each layer being substantially uniformly distributed about the circumferential length of the toroidal coil and having psuedo-perfect symmetry, and each toroidal coil further including a compensating turn of wire for each layer of turns, each compensating turn extending throughout the circumferential length of the coil at a position intermediate the inner and outer diameters thereof; and both of the voltage and current responsive analog voltage signals being effective for connection to high impedance and low level signal inputs of the electronic measuring circuit.

8. A meter as recited in claim 7, wherein each current transducer further comprises:

a core of generally annular configuration on which the toroidal coil is wound, the core substantially defining the inner and outer diameters, the axial length and the rectangular cross-section of the toroidal coil as wound thereon.

9. A meter as recited in claim 8, wherein, as to each current transducer:

the core is formed of a non-metallic, non-magnetic material having substantially the permeability of air.

10. An AC electric energy meter having an electronic measuring circuit processing analog signals responsive to current and voltage components, of an alternating electric current supplied by conductors of a power line distribution system, which are to be measured for producing electronic signals representative of quantized amounts of electric energy consumption, the meter comprising:

a housing adapted for series connection of the meter with at least two of the power line distribution system conductors carrying respective separate current flows which together comprise the current component of the electric energy quantity to be measured;

a voltage sensing transducer connected in parallel with the power line distribution system conductors for production a voltage responsive analog voltage signal proportional to the voltage component;

current sensing transducer means comprising first and second current conductors respectively, individually connected serially with the power line distribution system conductors for conducting the corresponding separate current flows of the current component, each of the current conductors having first and second ends and a substantially straight axial portion therebetween of a predetermined length and defining a central axis and effectively forming a single turn primary winding for producing magnetic flux variations responsive to the magnitude and rate of change of the separate current flow therein, and at least first and second, generally cylindrical sleeves of conductive material of substantially the predetermined length, received coaxially over the respective, at least first and second elongated current conductors in the straight axial portions thereof and electrically insulated therefrom;

the current sensing transducer means further comprising secondary winding means comprising at least first and second toroidal sensor coils wound on respective, separate non-magnetic cores, each toroidal sensor coil defining a central axis and having an axial length less than approximately one-third the length of the generally cylindrical sleeve and an internal diameter substantially the same as the outer diameter of the cylindrical sleeve and sufficient to position the coil coaxially on the cylindrical sleeve, the coil being positioned coaxially thereon and generally centrally of the length thereof, the toroidal coil having a rectangular cross-section in a plane extending radially from and including the central axis of the coil, each longer leg of the rectangular cross-section, corresponding to the axial length of the coil, being parallel to the central axis of the current conductor and each shorter leg being transverse to the central axis and defining the outer diameter of the coil relatively to the inner diameter thereof, the toroidal coils being inductively coupled and thereby responsive to magnetic flux variations produced by alternating current flows through the respective current conductors for producing a summed, analog voltage signal output which is substantially linearly responsive to the time derivative of the total current flow in the current conductors throughout a ratio of current flow variations therethrough of a least 400 to 1;

each of the coils having a number of turns determined in accordance with producing the substantially linearly responsive analog voltage signal output at levels extending through a predetermined voltage range, the turns in each coil being provided in an equal, integer number of layers, each layer comprising a common number of turns and the turns of each layer being substantially uniformly distributed about the circumferential length of the toroidal coil, the turns of the coil, in each layer of turns, being wound in a conventional toroidal coil winding operation with normal winding control tolerances, the substantially uniform distribution of turns in each layer including winding defects within a normal tolerance range which produce corresponding abberations in the contribution to the analog voltage signal output of the coil as produced by each layer of turns, and the abberations in the respective contributions of the plural, integer number of layers of turns to the analog voltage signal output being substantially self-cancelling, thereby maintaining the analog voltage signal output of the coil substantially linearly responsive to the time derivative of the current flow through the current conductor over the predetermined voltage range, and each toroidal coil further including a compensating turn of wire for each layer of turns, each compensating turn extending throughout the circumferential length of the coil at a position intermediate the inner and outer diameters thereof; and both of the voltage and current responsive analog voltage and current signals being effective for connection to high impedance and low level signal inputs of the electronic measuring circuit.

11. A meter as recited in claim 7, wherein, as to each current transducer:

each said coil has an axial length in the range of from 0.250 to 0.510 inches, an inner diameter in the range of from 0.250 to 0.380 inches, and an outer diameter of from 0.680 to 0.810 inches.

12. A meter as recited in claim 8, wherein, as to each current transducer:

the core has an axial height of approximately 0.250 inches, and internal diameter of approximately 0.380 inches and an external diameter of approximately 0.680 inches.

13. A method for producing a mutual inductance differential current transducer for producing an analog voltage output signal in response to, and having a level varying linearly over a predetermined range of voltage levels with respect to, the magnitude and rate of change of a flow of current supplied by an alternating current power line distribution system, comprising:

providing an elongated current conductor having first and second ends and a substantially straight axial portion therebetween of a predetermined length and defining a central axis for series-connection to the current flow from the system;

providing a generally cylindrical sleeve of conductive material of substantially the predetermined length, received coaxially over the elongated current conductor in the straight axial portion therof and electrically insulated therefrom;

providing a toroidal sensor coil having a central axis and an axial length less than approximately one-third the length of the generally cylindrical sleeve and an internal diameter substantially the same as the outer diameter of the cylindrical sleeve and sufficient to position the coil coaxially on the cylindrical sleeve and generally centrally of the length thereof, in accordance with:

defining the dimensions of a rectangular cross-section of the coil in a plane extending radially from and including the central axis of the coil such that each longer leg of the rectangular cross-section, corresponding to the axial length of the coil, is parallel to the central axis and each shorter leg is transverse to the central axis and defines the outer diameter of the coil relatively to the inner diameter thereof, the toroidal coil to be inductively coupled and thereby responsive to magnetic flux variations produced by an alternating current flow through the current conductor for producing an analog voltage signal output which is substantially linearly responsive to the time derivative of the current flow in the current conductor throughout a ratio of current flow variations therethrough of at least 400 to 1, determining the total number of turns of the coil in accordance with the coil producing the predetermined rang of voltage levels of the substantially linearly responsive analog voltage signal output, winding the predetermined number of turns in an integer number of layers, each layer comprising a common number of turns and the turns of each layer being substantially uniformly distributed about the circumferential length of the toroidal coil so as to afford psuedo-perfect symmetry of the coil, and providing a compensating turn of wire for each layer of turns, each compensating turn extending throughout the circumferential length of the coil at a position intermediate the inner and outer diameters thereof.

14. A method for producing a mutual inductance differential current transducer for producing an analog voltage output signal in response to, and having a level varying linearly over a predetermined range of voltage levels with respect to, the magnitude and rate of change of a flow of current supplied by an alternating current power line distribution system, comprising:

providing an elongated current conductor having first and second ends and a substantially straight axial portion therebetween of a predetermined length and defining a central axis for series-connection to the current flow from the system;

providing a generally cylindrical sleeve of conductive material of substantially the predetermined length, received coaxially over the elongated current conductor in the straight axial portion thereof and electrically insulated therefrom;

providing a toroidal sensor coil having a central axis and an axial length less than approximately one-third the length of the generally cylindrical sleeve and an internal diameter substantially the same as the outer diameter of the cylindrical sleeve and sufficient to position the coil coaxially on the cylindrical sleeve and generally centrally of the length thereof, in accordance with:

defining the dimensions of a rectangular cross-section of the coil in a plane extending radially from and including the central axis of the coil such that each longer leg of the rectangular cross-section, corresponding to the axial length of the coil, is parallel to the central axis and each shorter leg is transverse to the central axis and defines the outer diameter of the coil relatively to the inner diameter thereof, the toroidal coil to be inductively coupled and thereby responsive to magnetic flux variations produced by an alternating current flow through the current conductor for producing an analog voltage signal output which is substantially linearly responsive to the time derivative of the current flow in the current conductor throughout a ratio of current flow variations therethrough of at least 400 to 1, determining the total number of turns of the coil in accordance with the coil producing the predetermined range of voltage levels of the substantially linearly responsive analog voltage signal output, winding the predetermined number of turns in an integer number of layers, each layer comprising a common number of turns and the turns of each layer being substantially uniformly distributed about the circumferential length of the toroidal coil in a conventional toroidal coil winding operation utilizing normal winding control for producing a substantially uniform distribution of turns in each layer including within each layer a normal tolerance range of winding defects which produce corresponding abberations in the contribution to the analog voltage signal output of the coil as produced by each layer of turns;

maintaining the winding operation with the same normal winding control so as to produce a substantially uniform distribution of winding defects within the coil, for the plural layers of plural turns thereof, whereby the abberations in the respective contributions of the plural, integer number of layers of turns to the analog voltage signal output of the coil are substantially self-cancelling, thereby to maintain the analog voltage signal output of the coil substantially linearly responsive to the time derivative of the current flow through the current conductor over the predetermined voltage range; and providing a compensating turn of wire for each layer of turns, each compensating turn extending throughout the circumferential length of the coil at a position intermediate the inner and outer diameters thereof.

* * * * *